United States Patent
Li et al.

(10) Patent No.: US 10,061,747 B2
(45) Date of Patent: Aug. 28, 2018

(54) STORAGE OF A MATRIX ON A STORAGE COMPUTE DEVICE

(71) Applicant: Seagate Technology LLC, Cupertino, CA (US)

(72) Inventors: Peng Li, Lauderdale, MN (US); Richard Esten Bohn, Shakopee, MN (US); David Tetzlaff, Minnetonka, MN (US)

(73) Assignee: Seagate Technology LLC, Cupertino, CA (US)

( * ) Notice: Subject to any disclaimer, the term of this patent is extended or adjusted under 35 U.S.C. 154(b) by 498 days.

(21) Appl. No.: 14/704,128

(22) Filed: May 5, 2015

(65) Prior Publication Data
US 2015/0326245 A1 Nov. 12, 2015

Related U.S. Application Data

(60) Provisional application No. 61/989,872, filed on May 7, 2014.

(51) Int. Cl.
| | | |
|---|---|---|
| *G06F 17/00* | (2006.01) | |
| *G06F 17/30* | (2006.01) | |
| *G06F 17/16* | (2006.01) | |
| *H03M 7/30* | (2006.01) | |
| *H03M 7/40* | (2006.01) | |

(52) U.S. Cl.
CPC ............. *G06F 17/16* (2013.01); *H03M 7/30* (2013.01); *H03M 7/4031* (2013.01)

(58) Field of Classification Search
CPC .................................. H03M 7/30; G06F 17/16
See application file for complete search history.

(56) References Cited

U.S. PATENT DOCUMENTS

| | | | |
|---|---|---|---|
| 6,212,515 B1 | 4/2001 | Rogers | |
| 6,944,747 B2 | 9/2005 | Nair et al. | |
| 7,257,602 B2 * | 8/2007 | Pulst | G06F 17/16 706/45 |
| 7,805,466 B2 | 9/2010 | Aspinall | |
| 9,396,104 B1 * | 7/2016 | Danilak | G06F 3/0679 |
| 2013/0268242 A1 | 10/2013 | Ferre et al. | |
| 2014/0258689 A1 * | 9/2014 | Song | G06F 17/10 712/221 |

OTHER PUBLICATIONS

Jeremiah Willcock and Andrew Lumsdaine, "Accelerating Sparse Matrix Computations via Data Compression," ICS' 06 Jun. 28-30, Cairns, Quesnsland Australia, Copyright 2006 ACM, pp. 307-316.*

* cited by examiner

*Primary Examiner* — Cheryl Lewis
(74) *Attorney, Agent, or Firm* — Hollingsworth Davis, LLC

(57) ABSTRACT

A compressed format is selected for storage of a matrix based on a computation to be performed using the matrix and architecture of a storage compute device to which the matrix is stored. Data of the matrix is stored on the storage compute device according to the compressed format. The computation is performed using the data via a computation unit that resides within the storage compute device.

21 Claims, 6 Drawing Sheets

| OMT Data Structure Elements ||
|---|---|
| Element | Description |
| Matrix name (or a unique key for this matrix) | Name (or key) of the matrix. The matrix name (or key) is used for locating the matrix in the storage compute device via the forward table address. |
| Number of rows | The number of rows in the matrix. |
| Number of columns | The number of columns in the matrix. |
| Data type | The basic data type of the elements in the matrix, for example, an 8-bit integer number, a 16-bit integer number, a 32-bit integer number, double, and so on. |
| Matrix type | The format of the matrix, for example dense, CSR, CSC, COO, DIA, SKY, BSR, and ELL. |
| Forward table addresses | Points to the LBA address of a forward table of the matrix. The forward table maps each column of the matrix to a physical address, e.g., NAND flash page address. |
| Other system information | For example, date/time created/modified, addional notes and comments. |

*FIG. 2*

STORAGE OF A MATRIX ON A STORAGE COMPUTE DEVICE

RELATED PATENT DOCUMENTS

This application claims the benefit of Provisional Patent Application Ser. No. 61/989,872 filed on May 7, 2014, to which priority is claimed pursuant to 35 U.S.C. § 119(e), and which is incorporated herein by reference in its entirety

SUMMARY

The present disclosure is related to storage compute devices. In one embodiment, methods and apparatuses facilitate selecting a compressed format for storage of a matrix based on a computation to be performed using the matrix and architecture of a storage compute device to which the matrix is stored. Data of the matrix is stored on the storage compute device according to the compressed format. The computation is performed using the data via a computation unit that resides within the storage compute device.

In another embodiment, methods and apparatuses facilitate receiving, at a storage compute device from a host, matrix data and a computation to be performed on the matrix data by the storage compute device. A format for storage of a matrix is selected, the format selected based on the computation and known attributes of a hardware matrix computation engine of the storage compute device. Data of the matrix is stored on the storage compute device according to the format. The computation is performed using the stored via the hardware matrix computation engine.

In another embodiment, methods and apparatuses facilitate receiving, at a storage compute device from a host, matrix data and an indicator of a matrix storage format selected from a plurality of formats. The matrix data and metadata is stored on the storage compute device. The metadata describes a matrix object associated with the matrix data and includes an indicator of the matrix format and a location of the matrix data. A computation is performed on the matrix object at the storage compute device.

These and other features and aspects of various embodiments may be understood in view of the following detailed discussion and accompanying drawings.

BRIEF DESCRIPTION OF THE DRAWINGS

In the following diagrams, the same reference numbers may be used to identify similar/same components in multiple figures. The drawings are not necessarily to scale.

FIG. 2 is a table showing elements of an object metadata table according to an example embodiment;

DETAILED DESCRIPTION

Figure 1:
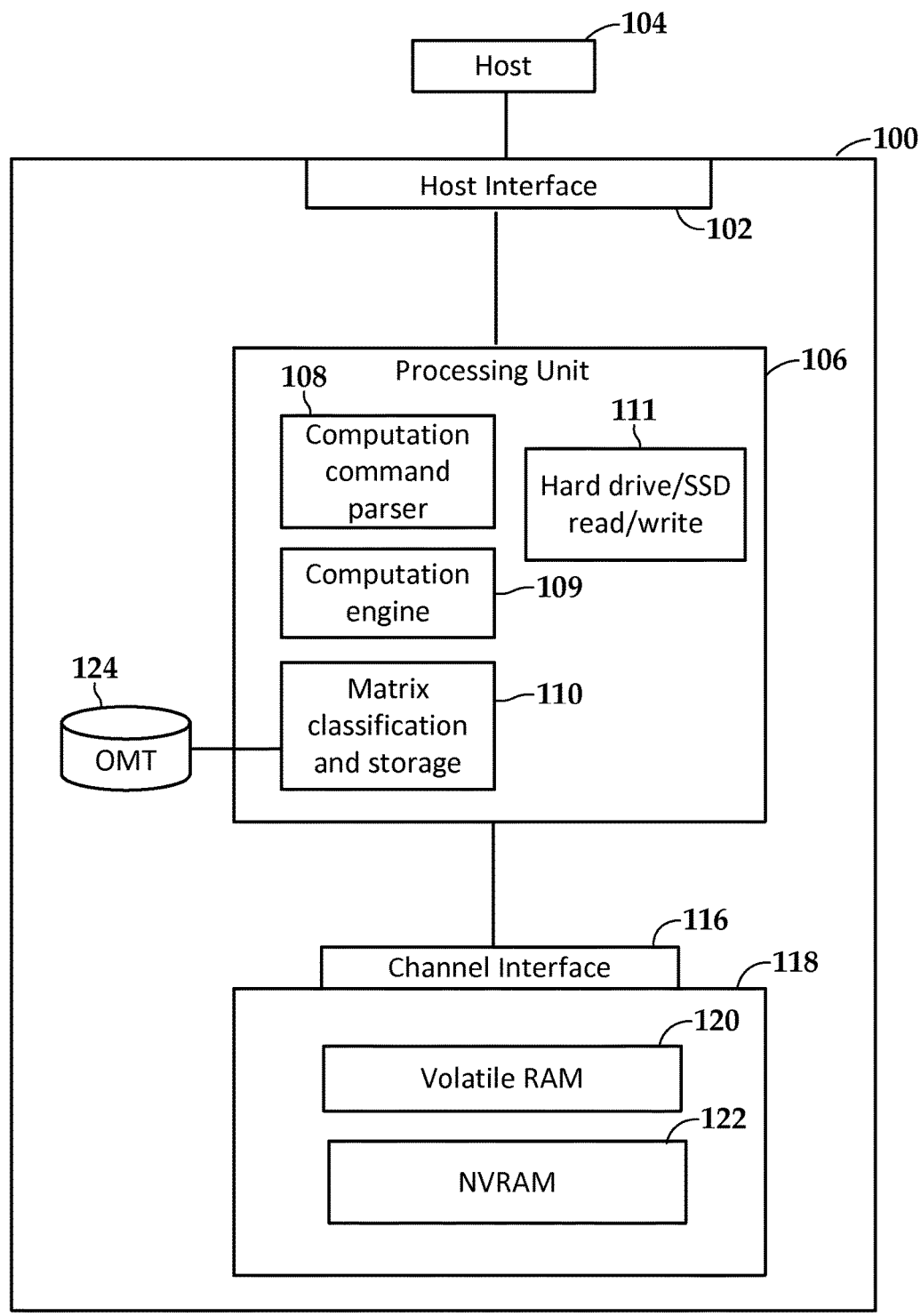
FIG. 1 is a block diagram of a storage compute device according to an example embodiment.

Some computational tasks are well suited to be performed using massively distributed computing resources. For example, data centers that provide web services, email, data storage, Internet search, etc., often distribute tasks among hundreds or thousands of computing nodes. The nodes are interchangeable and tasks may be performed in parallel by multiple computing nodes. This parallelism increases processing and communication speed, as well as increasing reliability through redundancy. Generally, the nodes are rack mounted computers that are designed to be compact and power efficient, but otherwise operate similarly to desktop computer or server.

For certain types of tasks, it may be desirable to rearrange how data is processed within the individual nodes. For example, applications such as neuromorphic computing, scientific simulations, etc., may utilize large matrices that are processed in parallel by multiple computing nodes. In a traditional computing setup, matrix data may be stored in random access memory and/or non-volatile memory, where it is retrieved, operated on by relatively fast central processor unit (CPU) cores, and the results sent back to volatile and/or non-volatile memory. It has been shown that the bus lines and I/O protocols between the CPU cores and the memory are a bottleneck for this type of computation.

This disclosure generally relates to use of a data storage device that performs internal computations on data on behalf of a host, and is referred to herein as a storage compute device. While a data storage device, such as a hard drive, solid-state drive (SSD), hybrid drive, etc., generally include data processing capabilities, such processing is related to the storage and retrieval of user data. So while the data storage device may perform some computations on the data, such as compression, error correction, etc., these computations are invisible to the host. Similarly, other computations, such as logical-to-physical address mapping, involve tracking host requests, but are intended to hide these tracking operations from the host.

While a storage compute device as described herein may be able to perform as a conventional storage device, e.g., handling host data storage and retrieval requests, such devices may include additional computational capability that can be used for certain applications. For example, scientific and engineer simulations may involve solving matrix equations on very large matrices. Even though the matrices may be sparse, and therefore amenable to a more concise/compressed format for storage, the matrices may be still be so large as to prevent solution using random access memory (RAM) of a single computing node.

One solution to solving these large matrix problems is to distribute the solution among a number of nodes coupled by a network. Each node will solve part of the problem, and various internode messages are passed to coordinate operations and shared data between the nodes. While this can alleviate the need for large amounts of RAM on each node, it has been found that in some cases this does not effectively use processing resources. For example, the central processing units (CPUs) may spend significant amounts of time waiting for network input/output (I/O) and be underutilized as a result.

It generally accepted that compute performance can be improved by keeping the data "close to" the processors that operate on the data. This closeness refers both to physical proximity and reduction in the number of different communications channels and protocol layers that lie between the data in memory and the processor. While CPU and RAM might qualify as close to one another (particularly when using hierarchical memory caches), the size of system RAM may be limited for some problems. In such a case, the system bottlenecks occur in from slower channels (e.g., disk drives, network interfaces) moving data in and out of RAM as needed.

For problems and applications that work on very large sets of data, a local non-volatile memory may be needed to store the data sets, as well as intermediate results of calculations. While the speed of currently available non-volatile RAM (NVRAM) is appreciably slower than currently available dynamic RAM (DRAM), for problems with large data sets, an increase in performance may be seen by performing the computations on the storage device itself. While the processor and memory resident on typical storage devices may be slower than CPU and RAM of typical computers, the amount of NVRAM available can be orders of magnitude greater than RAM for similar cost. Further, the storage device can move large amounts of between its non-volatile memory and its local processor more quickly that it could move the same data to a CPU. Internal data processing does not have to deal with contention, translation, protocols, etc., that is involve in moving data between the host interface of the storage device and the CPU cores.

In FIG. 1, a block diagram shows a storage compute device 100 according to an example embodiment. The storage compute device 100 may provide capabilities usually associated with data storage devices, e.g., storing and retrieving blocks of data, and may include additional computation abilities as noted above. Generally, the storage compute device 100 includes a host interface 102 configured to communicate with a host 104. The host interface 102 may use electrical specifications and protocols associated with existing hard drive host interfaces, such as SATA, SaS, SCSI, PCI, Fibre Channel, etc.

The storage compute device 100 includes a processing unit 106. The processing unit 106 includes hardware such as general-purpose and/or special-purpose logic circuitry configured to perform functions of the storage compute device 100, including functions indicated in functional blocks 108-111. Functional block 111 provides legacy hard drive or SSD functionality, such as read, write, and verify operations on stored data. Blocks 108-110 represent specialized functionalities that allow the storage compute device 100 to provide internal computations on behalf of the host 104.

Block 108 represents a command parser that manages object-specific and computation-specific communications between the host 104 and storage compute device 100. For example, the block 108 may process commands that define objects (matrices, vectors, scalars, sparse distributed representations) and operations (e.g., scalar/matrix mathematical and logical operations) to be performed on the objects. A computation engine 109 performs the operations on the objects, and may be specially configured for a particular class of operation. For example, if the storage compute device 100 is configured to perform a set of matrix operations, then the computation engine 109 may be optimized for that set of operations. The optimization may include knowledge of how best to store and retrieve objects for the particular storage architecture used by the storage compute device 100.

In this embodiment, a matrix classification and storage block 110 facilitates classification and optimization of different matrix storage formats. The matrix classification and storage block 110 can receive sparse or dense matrices as objects from the host 104 via the host interface 102, and ensure the storage format is the most efficient based on, among other things, particulars of the storage device architecture and operations targeted for the matrices. For example, a sparse matrix is mostly zeros, and it may be more efficient for large matrices to utilize a compressed format of the matrix rather than a dense representation (e.g., two-dimensional array of numbers, including the zeros). A compressed format may mostly store non-zero data and utilize particular format and/or metadata to describe where in the matrix the stored data resides. The rest of the matrix can be assumed to be filled with zeroes. Some compressed formats may be better suited than others for a particular use, and as described below, the matrix classification and storage block 110 can support formats specified by the host 104. In some cases, the matrix classification and storage block 110 can translate between formats, either at the request of the host 104 or based on an internal determination.

As noted above, the functional blocks 108-111 may at some point need to access persistent storage, and this can be done by way of a channel interface 116 that provides access to memory 118. There may be a multiple channels, and there may be a dedicated channel interface 116 and computation engine 109 for each channel. The memory 118 may include both volatile memory 120 (e.g., DRAM and SRAM) and non-volatile memory (e.g., flash memory, magnetic media). The volatile memory 120 may be used as a cache for read/write operations performed by read/write block 111, such that a caching algorithm ensures data temporarily stored in volatile memory 120 eventually gets stored in the non-volatile memory 122. The computation blocks 108-110 may also have the ability to allocate and use volatile memory for calculations. Intermediate results of calculations may remain in volatile memory 120 until complete and/or be stored in non-volatile memory 122.

In one embodiment, the function blocks 108-111 are configured to support the sparse and dense matrix basic linear algebra subprogram (BLAS) operations at the storage device level. If the matrix is a sparse matrix, a number of different compressed storage formats may be used. For purposes of illustration and not of limitation, six different sparse matrix storage formats are discussed herein. The formats include compressed sparse row format (CSR), compressed sparse column format (CSC), coordinate format (COO), diagonal format (DIA), skyline format (SKY), block sparse row format (BSR), and ELLPACK format (ELL).

When a matrix is created/stored in a storage compute device, an object metadata table (OMT) entry is created for the matrix. As seen in FIG. 1, the OMT can be stored in database 124. It will be understood that the term "table" in the OMT is not intended to limit the data structures used to form the object metadata, and other structures such as lists, trees, etc. may be used. The database 124 may be maintained in the volatile RAM 120 during device operation, and can be loaded to the NVRAM 122 in response to powering off.

For different matrix types, the OMT structure is slightly different. Below, OMT structures are described for each of seven example matrix types, including dense matrices and sparse matrices with CSR, CSC, COO, DIA, SKY, BSR, and ELL formats. These formats are supported in various publicly available BLAS libraries, such as the U.S. National Institute of Standards and Technology (NIST) sparse BLAS libraries. It will be understood that the concepts below may be extended to provide support for other matrix formats, and the formats are described below for purposes of illustration and not limitation.

When a dense matrix is created in the storage compute device, the information can be created as shown in Table 1 (see FIG. 2 for description of data structure elements). This information includes the matrix name, the number of rows of the matrix, the number of columns of the matrix, the data type of the matrix, the matrix type, the physical address of a forward table which records the physical locations of the matrix data, the data and time when this matrix is created and updated, and additional notes or comments of this matrix.

TABLE 1

Data structure of the OMT of a dense matrix.

Matrix name (or an unique key of this matrix)
Number of rows
Number of columns
Data type
Matrix type
Forward table address
Other system information, such as date/
time when it was created and modified,
and additional comments of this object.

The OMT may have a fixed size, and be located in a pre-reserved logical block address (LBA) space. This space can be defined in firmware and device driver. For example, if the storage compute device supports storing a maximum of 1K matrix objects, the firmware will reserve 4M bytes of LBA space to store all the OMT data. Based on the matrix type, data type, number of rows and columns in the OMT, the firmware allocates the corresponding LBA space for storing the actual data of the matrix. The starting address of these data is stored in the forward table address entry in the OMT. The address of any element in this matrix can be found using this starting address, the data type, the matrix type, and the number of rows and columns. In FIG. 2, a table shows the description of each element in the OMT, these elements being common to all the OMT formats described herein. Particular formats may have additional fields as described below.

A sparse matrix is a matrix in which most elements are zeros. The CSR format is a compressed data storage format for the sparse matrix. More specifically, CSR is (val, col_ind, row_ptr), where val is an array of the (left-to-right, then top-to-bottom) non-zero values of the matrix; col_ind is the column indices corresponding to the values; and row_ptr is the list of value indexes where each row starts. For example, the matrix A below can be represented in the CSR format show in Table 2:

TABLE 2

CSR format of matrix A $$A = \begin{bmatrix} 6 & -2 & 0 & -4 & 0 \\ 3 & 7 & 0 & 0 & 0 \\ 0 & 0 & 2 & 3 & 2 \\ -4 & 0 & 1 & 7 & 0 \\ 0 & 5 & 0 & 0 & -1 \end{bmatrix}$$

| Entry | 1 | 2 | 3 | 4 | 5 | 6 | 7 | 8 | 9 | 10 | 11 | 12 | 13 |
|---|---|---|---|---|---|---|---|---|---|---|---|---|---|
| val | 6 | -2 | -4 | 3 | 7 | 2 | 3 | 2 | -4 | 1 | 7 | 5 | -1 |
| col_ind | 1 | 2 | 4 | 1 | 2 | 3 | 4 | 5 | 1 | 3 | 4 | 2 | 5 |
| row_ptr | 1 | 4 | 6 | 9 | 12 | | | | | | | | |

Entry 1 of val is 6 because it is the first non-zero element (left-to-right, then top-to-bottom) in matrix A (row 1 column 1). Entry 2 of val is -2 because it is the second non-zero element (left-to-right, then top-to-bottom) in matrix A (row 1 column 2). So on and so forth. There are 13 non-zero elements in matrix A, and so the number of entries of val is 13.

Entry 1 of col_ind is 1 because the corresponding entry in val is in the column 1. Entry 2 of col_ind is 2 because the corresponding entry in val is in the column 2. Entry 3 of col_ind is 4 because the corresponding entry in val is in the column 4. So on and so forth. The number of entries in col_ind is the same as the val.

Entry 1 of row_ptr is 1 because the first row of matrix A starts at entry 1 of val. Entry 2 of row_ptr is 4 because the second row of matrix A starts at entry 4 of val. Entry 3 of row_ptr is 6 because the third row of matrix A starts at entry 6 of val. So on and so forth. The number of entries in row_ptr is the same as the number of rows in matrix A.

The OMT structure of the sparse matrix with CSR format is similar to the dense matrix, which is shown in Table 3 (see FIG. 2 for description of data structure elements). Compared to the OMT of the dense matrix, it has an additional entry to record the number of non-zero elements. It also stores three different the forward table addresses for val, col_ind, and row_ptr.

TABLE 3

Data structure of the OMT of a sparse matrix with CSR format

Matrix name (or the unique key of this matrix)
Number of rows
Number of columns
Number of non-zero elements
Data type
Matrix type
Forward table address for val
Forward table address for col_ind
Forward table address for row_ptr
Other system information The CSC format is similar to the CSR format except that the values are read first by column, a row index is stored for each non-zero value, and column pointers are stored. More specifically, CSC is (val, row_ind, col_ptr), where val is an array of the (top-to-bottom, then left-to-right) non-zero values of the matrix; row_ind is the row indices corresponding to the values; and col_ptr is the list of value indexes where each row starts. For example, the same matrix A can be represented in the CSC format show in Table 4.

TABLE 4

CSC format of matrix A.

$$A = \begin{bmatrix} 6 & -2 & 0 & -4 & 0 \\ 3 & 7 & 0 & 0 & 0 \\ 0 & 0 & 2 & 3 & 2 \\ -4 & 0 & 1 & 7 & 0 \\ 0 & 5 & 0 & 0 & -1 \end{bmatrix}$$

| Entry | 1 | 2 | 3 | 4 | 5 | 6 | 7 | 8 | 9 | 10 | 11 | 12 | 13 |
|---|---|---|---|---|---|---|---|---|---|---|---|---|---|
| val | 6 | 3 | -4 | -2 | 7 | 5 | 2 | 1 | -4 | 3 | 7 | 2 | -1 |
| row_ind | 1 | 2 | 4 | 1 | 2 | 5 | 3 | 4 | 1 | 3 | 4 | 3 | 5 |
| col_ptr | 1 | 4 | 7 | 9 | 12 | | | | | | | | |

Entry 1 of val is 6 because it is the first non-zero element (top-to-bottom, then left-to-right) in matrix A (row 1 column 1). Entry 2 of val is 3 because it is the second non-zero element (top-to-bottom, then left-to-right) in matrix A (row 2 column 1). So on and so forth. We have 13 non-zero elements in matrix A. Thus, the number of entries of val is 13.

Entry 1 of row_ind is 1 because the corresponding entry in val is in the row 1. Entry 2 of row_ind is 2 because the corresponding entry in val is in the row 2. Entry 3 of row_ind is 4 because the corresponding entry in val is in the row 4. So on and so forth. The number of entries in row_ind is the same as the val.

Entry 1 of col_ptr is 1 because the first column of matrix A starts at entry 1 of val. Entry 2 of col_ptr is 4 because the second column of matrix A starts at entry 4 of val. Entry 3 of col_ptr is 7 because the third column of matrix A starts at entry 7 of val. So on and so forth. The number of entries in col_ptr is the same as the number of columns in matrix A.

The OMT structure of the sparse matrix with CSC format is similar to the sparse matrix with CSR format, which is shown in Table 5 (see FIG. 2 for description of data structure elements).

TABLE 5

Data structure of the OMT of a sparse matrix with CSC format.

Matrix name (or the unique key of this matrix)
Number of rows
Number of columns

TABLE 5-continued

Data structure of the OMT of a sparse matrix with CSC format.

Number of non-zero elements
Data type
Matrix type
Forward table address for val
Forward table address for row_ind
Forward table address for col_ptr
Other system information The COO format stores a list of (row, column, value) tuples. For example, the same matrix A can be represented in the COO format show in Table 6.

TABLE 2

COO format of matrix A.

$$A = \begin{bmatrix} 6 & -2 & 0 & -4 & 0 \\ 3 & 7 & 0 & 0 & 0 \\ 0 & 0 & 2 & 3 & 2 \\ -4 & 0 & 1 & 7 & 0 \\ 0 & 5 & 0 & 0 & -1 \end{bmatrix}$$

| Entry | 1 | 2 | 3 | 4 | 5 | 6 | 7 | 8 | 9 | 10 | 11 | 12 | 13 |
|---|---|---|---|---|---|---|---|---|---|---|---|---|---|
| value | 6 | -2 | -4 | 3 | 7 | 2 | 3 | 2 | -4 | 1 | 7 | 5 | -1 |
| row | 1 | 1 | 1 | 2 | 2 | 3 | 3 | 3 | 4 | 4 | 4 | 5 | 5 |
| column | 1 | 2 | 4 | 1 | 2 | 3 | 4 | 5 | 1 | 3 | 4 | 2 | 5 |

Entry 1 of value is 6 because it is the first non-zero element (left-to-right, then top-to-bottom) in matrix A (row 1 column 1). Entry 2 of value is −2 because it is the second non-zero element (left-to-right, then top-to-bottom) in matrix A (row 1 column 2). So on and so forth. We have 13 non-zero elements in matrix A. Thus, the number of entries of value is 13.

Entry 1 of row is 1 because the corresponding entry in value is in the row 1. Entry 2 and 3 of row is 1 because the corresponding entries in value is still in the row 1. Entry 4 of row is 2 because the corresponding entry in value is in the row 2. So on and so forth. The number of entries in row is the same as the values.

Entry 1 of column is 1 because the corresponding entry in value is in the column 1. Entry 2 of column is 2 because the corresponding entries in value is still in the column 2. Entry 3 of column is 4 because the corresponding entry in value is in the column 4. So on and so forth. The number of entries in column is the same as the values.

The OMT structure of the sparse matrix with COO format is similar to the sparse matrix with CSR and CSC formats, which is shown in Table 7 (see FIG. 2 for description of data structure elements).

TABLE 7

Data structure of the OMT of a sparse matrix with CSC format.

Matrix name (or the unique key of the matrix)
Number of rows
Number of columns
Number of non-zero elements
Data type
Matrix type
Forward table address for value
Forward table address for row
Forward table address for column
Other system information If the sparse matrix has diagonals containing only zero elements, then the DIA format can be used to reduce the amount of information needed to locate the non-zero elements. The DIA format stores two arrays: values and distance. The "values" matrix is lval by ndiag in size, where lval is the number of rows of the sparse matrix, and ndiag is the number of non-empty diagonals. The distance is an integer array with dimension ndiag. Element I of the array distance is the distance between i-diagonal and the main diagonal. For example, the matrix B can be represented in a "values" matrix and a "distance" array/vector as show below.

$$B = \begin{bmatrix} 6 & 0 & 0 & -4 & 0 \\ 3 & 7 & 0 & 0 & 0 \\ 0 & 0 & 2 & 0 & 0 \\ -4 & 0 & 1 & 7 & 0 \\ 0 & 5 & 0 & 0 & -1 \end{bmatrix}$$

$$values = \begin{bmatrix} * & * & 6 & * \\ * & 3 & 7 & * \\ * & 0 & 3 & * \\ -4 & 1 & 7 & -4 \\ 5 & 0 & -1 & 0 \end{bmatrix}$$

$$distance = [-3 \; -1 \; 0 \; 3]$$

It can be seen that "values" is a 5 by 4 matrix, because the sparse matrix B has 5 rows and 4 non-empty diagonals. The asterisks demote padded elements, they can be any values such as 0. The first column of the matrix values stores the first non-empty diagonal in the sparse matrix B (from bottom-left to up-right). The second column of the matrix values stores the second non-empty diagonal in the sparse matrix B.

The array "distance" has the 4 entries, because the sparse matrix B has 4 non-empty diagonals. The first entry of distance is −3 because the diagonal stored in the first column of the matrix values has a distance −3 to the main diagonal of the sparse matrix B. The second entry of distance is −1 because the diagonal stored in the second column of the matrix values has a distance −1 to the main diagonal of the sparse matrix B.

The OMT structure of the sparse matrix with DIA format is similar to the sparse matrix with other formats, which is shown in Table 8 (see FIG. 2 for description of data structure elements).

TABLE 3

Data structure of the OMT of a sparse matrix with DIA format.

Matrix name (or the unique key to this matrix)
Number of rows
Number of columns
Number of non-empty diagonals
Data type
Matrix type
Forward table address for values
Forward table address for distance
Other system information The SKY format is used for triangular matrices. This format is specified by two arrays: values and pointers. For a lower triangular matrix, "values" contains the set of elements from each row of the matrix starting from the first non-zero element to and including the diagonal element. For an upper triangular matrix it contains the set of elements from each column of the matrix starting with the first non-zero element down to and including the diagonal element. Encountered zero elements are included in the sets.

Pointers is an integer array with dimension (m+1), where m is the number of rows for lower triangle (columns for the upper triangle). Pointers(i)−Pointers(1)+1 gives the index of element in values that is first non-zero element in row (column) i. The value of pointers(m+1) is set to the number of elements in the array values plus pointers(1). For example, the matrix C can be represented in the SKY format show in Table 9.

TABLE 4

SKY format of matrix C.

$$C = \begin{bmatrix} 6 & 0 & 0 & 0 & 0 \\ 3 & 7 & 0 & 0 & 0 \\ 0 & 0 & 2 & 0 & 0 \\ -4 & 0 & 1 & 7 & 0 \\ 0 & 5 & 0 & 0 & -1 \end{bmatrix}$$

| Entry | 1 | 2 | 3 | 4 | 5 | 6 | 7 | 8 | 9 | 10 | 11 | 12 | 13 |
|---|---|---|---|---|---|---|---|---|---|---|---|---|---|
| values | 6 | 3 | 7 | 2 | −4 | 0 | 1 | 7 | 5 | 0 | 0 | −1 | |
| pointers | 1 | 2 | 4 | 5 | 9 | 13 | | | | | | | |

The OMT structure of the sparse matrix with SKY format is similar to the sparse matrix with other formats, which is shown in Table 10 (see FIG. 2 for description of data structure elements). We also record if the matrix is a lower triangular matrix or an upper triangular matrix in the Matrix type entry.

TABLE 10

Data structure of the OMT of a sparse matrix with SKY format.

Matrix name (or the unique key of this matrix)
Number of rows

TABLE 10-continued

Data structure of the OMT of a sparse matrix with SKY format.

Number of columns
Number of non-empty elements
Data type
Matrix type
Forward table address for values
Forward table address for pointers
Other system information The BSR format is specified by four arrays: values, columns, pointerB, and pointerE. The values array contains the elements of the non-zero blocks of a sparse matrix. The elements are stored block-by-block in row-major order. A non-zero block is the block that contains at least one non-zero element. All elements of non-zero blocks are stored, even if some of them is equal to zero. Within each non-zero block elements are stored in column-major order in the case of one-based indexing, and in row-major order in the case of the zero-based indexing.

In the columns array, element i of the integer array columns is the number of the column in the block matrix that contains the i-th non-zero block. In the pointerB array, element j of this integer array gives the index of the element in the columns array that is first non-zero block in a row j of the block matrix. In the pointerE array, Element j of this integer array gives the index of the element in the columns array that contains the last non-zero block in a row j of the block matrix plus 1.

For example, consider the matrix D below. If the size of the block equals 2, then the sparse matrix D can be represented as a 3×3 block matrix E, L, M, N, and P also shown below. The matrix D can be represented in the BSR format as shown in Table 11.

TABLE 11

BSR format of matrix D $$D = \begin{bmatrix} 1 & 0 & 0 & 0 & 0 & 0 \\ 2 & 1 & 0 & 0 & 0 & 0 \\ 0 & 0 & 1 & 4 & 0 & 0 \\ 0 & 0 & 5 & 1 & 0 & 0 \\ 0 & 0 & 4 & 3 & 7 & 2 \\ 0 & 0 & 0 & 0 & 0 & 0 \end{bmatrix}$$

$$E = \begin{bmatrix} L & 0 & 0 \\ 0 & M & 0 \\ 0 & N & P \end{bmatrix}$$

$$L = \begin{bmatrix} 1 & 0 \\ 2 & 1 \end{bmatrix}, M = \begin{bmatrix} 1 & 4 \\ 5 & 1 \end{bmatrix},$$

$$N = \begin{bmatrix} 4 & 3 \\ 0 & 0 \end{bmatrix}, P = \begin{bmatrix} 7 & 2 \\ 0 & 0 \end{bmatrix}$$

| Entry | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| values | 1 | 2 | 0 | 1 | 1 | 5 | 4 | 1 | 4 | 0 | 3 | 0 | 7 | 0 | 2 | 0 |
| columns | 1 | 2 | 2 | 3 | | | | | | | | | | | | |
| pointerB | 1 | 2 | 3 | | | | | | | | | | | | | |
| pointerE | 2 | 3 | 5 | | | | | | | | | | | | | |

The OMT structure of the sparse matrix with BSR format is similar to the sparse matrix with other formats, which is shown in Table 12 (see FIG. 2 for description of data structure elements).

TABLE 12

Data structure of the OMT of a sparse matrix with BSR format.

Matrix name (or the unique key of this matrix)
Number of rows
Number of columns
Number of non-empty blocks
Number of rows in the non-empty block
Number of columns in the non-empty block
Data type
Matrix type
Forward table address for values
Forward table address for columns
Forward table address for pointerB
Forward table address for pointerE
Other system information The ELL format is a storage format originally used by the ELLPACK package. In this storage format, two rectangular arrays are used to store the matrix. The arrays have the same number of rows as the original matrix, but only have as many columns as the maximum number of non-zeros on a row of the original matrix. One of the arrays holds the matrix entries, and the other array holds the column numbers from the original matrix. For example, the matrix E which has a maximum number of non-zeros per row of three, can be represented as the matrices "Values" and "Columns" as shown below.

$$E = \begin{bmatrix} 1 & 2 & 3 & 0 & 0 & 0 \\ 0 & 4 & 5 & 0 & 6 & 0 \\ 7 & 0 & 8 & 0 & 9 & 0 \\ 0 & 8 & 0 & 0 & 7 & 6 \\ 0 & 0 & 5 & 0 & 0 & 0 \\ 0 & 0 & 4 & 0 & 3 & 0 \end{bmatrix}$$

$$\text{Values} = \begin{bmatrix} 1 & 2 & 3 \\ 4 & 5 & 6 \\ 7 & 8 & 9 \\ 8 & 7 & 6 \\ 5 & 0 & 0 \\ 4 & 3 & 0 \end{bmatrix}, \text{Columns} = \begin{bmatrix} 1 & 2 & 3 \\ 2 & 3 & 5 \\ 1 & 3 & 5 \\ 2 & 5 & 6 \\ 3 & 0 & 0 \\ 3 & 5 & 0 \end{bmatrix}$$

The OMT structure of the sparse matrix with ELL format is similar to the sparse matrix with other formats, which is shown in Table 13 (see FIG. 2 for description of data structure elements).

TABLE 13

Data structure of the OMT of a sparse matrix with ELL format.

Matrix name (or the unique key of this matrix)
Number of rows
Number of columns
Number of rows in the values
Number of columns in the columns
Data type
Matrix type
Forward table address for values
Forward table address for columns
Other system information A storage compute devices as described above may utilize a number of different mechanisms for communicating with a host. For example, a custom command set may be utilized by the host, which may be coupled to the storage compute device by legacy or custom I/O interfaces. In order to leverage existing storage device protocols, and example embodiment is described below that can utilize existing storage device command sets. Generally, the data storage commands such as read and write are with a predefined address space where objects can be defined and computations executed. An example of this communications protocol is shown in the block diagram of FIG. 3.

Figure 3:
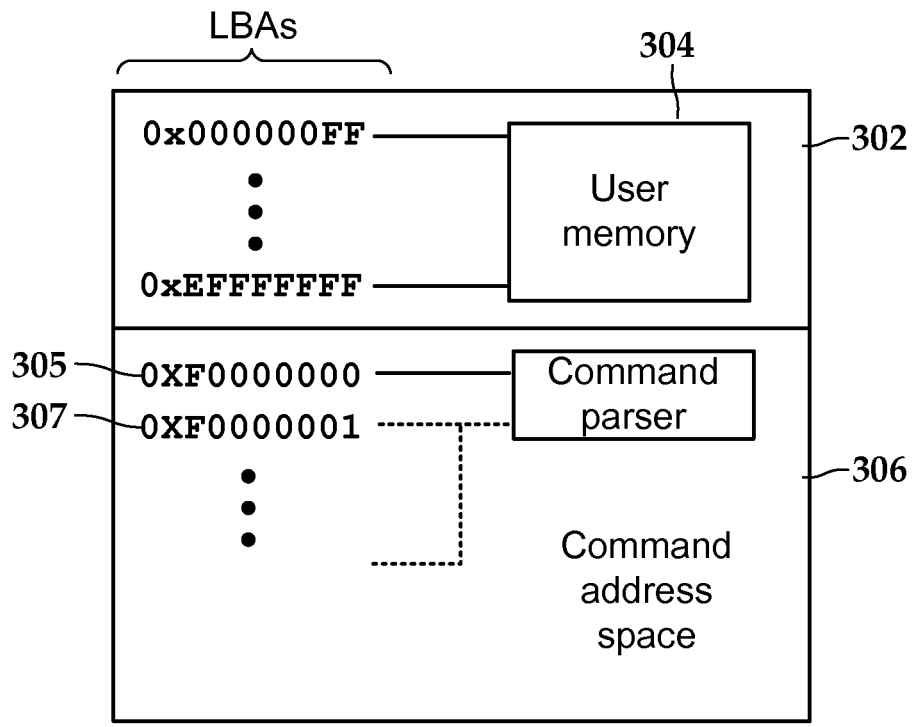
FIG. 3 is a block diagram illustrating logical block addresses used for computing commands according to an example embodiment.

A specific address for the storage compute device controller is defined, called the computing command address (CCA). It can be an offset plus the maximum LBA that the storage compute device supports. For example, as shown in FIG. 3, region 302 represents the range of LBAs that may be accessed for legacy data storage operations in user-accessible memory 304. As shown, the maximum LBA in region 302 is 0XEFFFFFFF. If the command address offset is one, then address of the CCA 305 will be 0XF0000000, as shown in regions 306. The storage compute device driver installed the host system will be able to recognize this address. The host CPU will control the storage compute device's computing functionality via the CCA 305 and may use other address in the command address spaces, as indicated by LBA 307. The control mechanism facilitates, among other things, creating a matrix object in the storage compute device, modifying the matrix object, and performing operations based on the matrix object.

Figure 4:
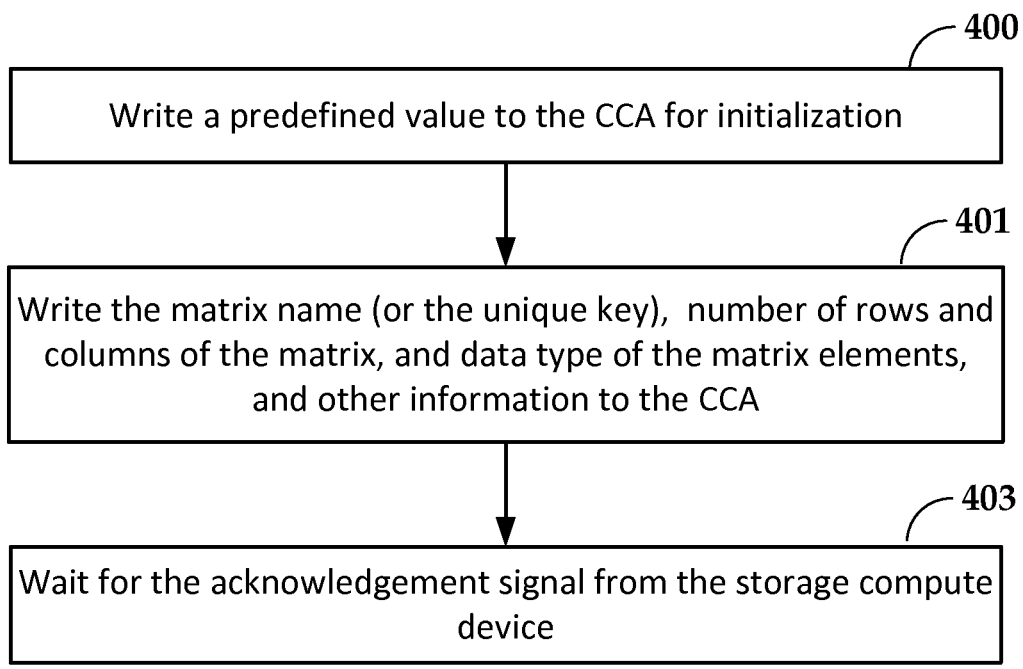
FIGS. 4-6 are flowcharts illustrating methods according to example embodiments.

In FIG. 4, a flowchart illustrates how a host defines a matrix on a storage computed device according to an example embodiment. To cause the matrix object to be created in the storage compute device, a specific value (for example, 0XF0F0F0F0) is written 400 to the CCA. This will make the storage compute device aware that a new matrix object will be created: the storage compute device will enter into a state to wait for the information for creating the OMT for the matrix object.

Other matrix data is then written 401, including the matrix name, number of rows, number of columns, element data type, and other information. This data may be written to the CCA (e.g., CCA 305 in FIG. 3) or another address in the control address space (e.g., LBA 307 in FIG. 3). The host then waits 403 for an acknowledgement. Once the storage compute device receives all the information, it will create the OMT, allocate physical space for the matrix, and send an acknowledgement signal to the host if success.

Once the host received the acknowledgement signal from the storage compute device, the matrix data can be sent to the storage compute device. The storage compute device flash translation layer can allocate the data to multiple NAND flash channels to fully utilize the internal parallelism, and update the corresponding forward tables for this matrix. In the storage compute device, each matrix object may have one or multiple forward tables based on their matrix types.

Figure 5:
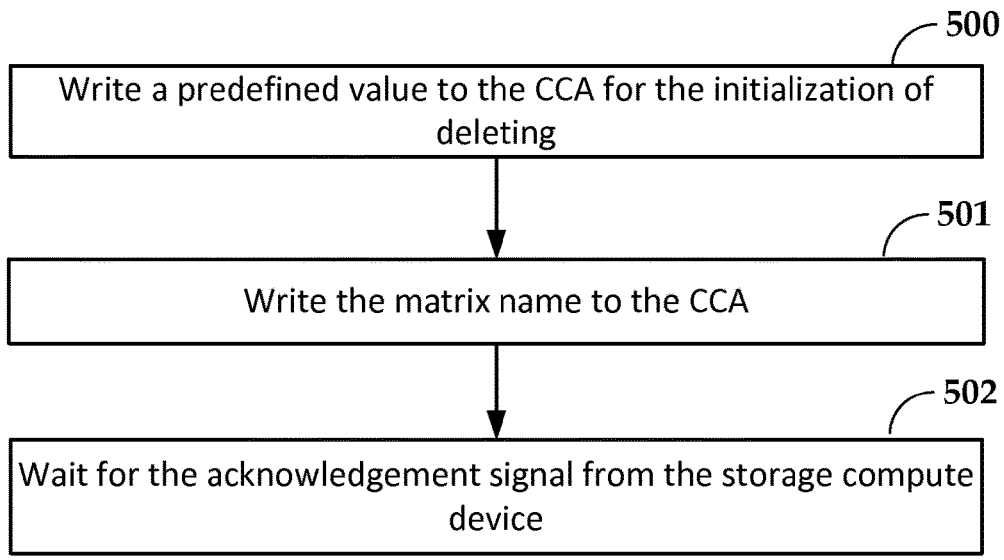

The host can also update or delete an existing matrix object stored in the storage compute device. To update the matrix, the same steps shown in FIG. 4 are used, except that a different initialization value is written at 400. For example, if 0XF0F0F0F0 is the initialization value for creating a matrix object, 0XF1F1F1F1 as the may be used as an initialization value for updating the matrix object. To delete the matrix the steps shown in the flowchart of FIG. 5 may be used. A predefined value specifying a deletion is written 500 to the CCA. The matrix name (or the unique key of this matrix) is then written 501, and the host waits 502 for acknowledgement.

Figure 6:
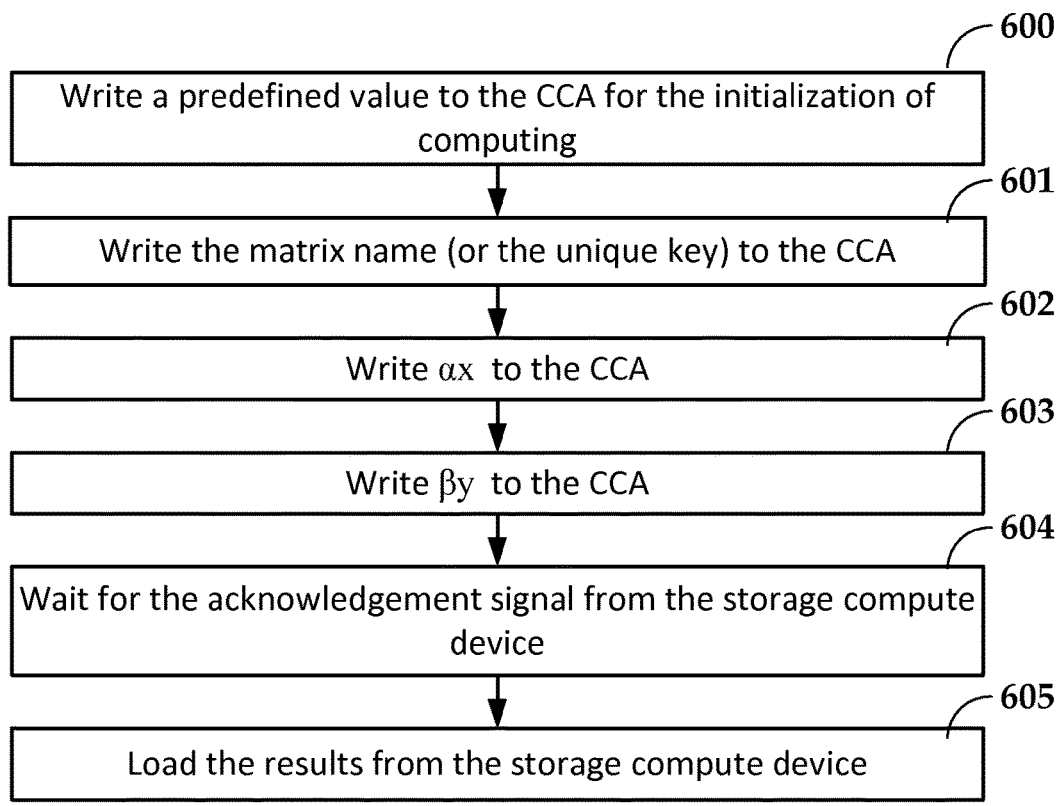

In reference now to FIG. 6, a flowchart illustrates how a host can execute operations on existing matrix objects according to an example embodiment. In this case, BLAS level 2 operations are performed, which are defined as the generalized matrix-vector multiplication of the form y←Ax+βy. A predefined value specifying a BLAS level 2 operation is written 600 to the CCA. The matrix name (or the unique key of this matrix) is then written 601, as are αx and βy at 602 and 603. Note that αx and βy are computed by the host. These two vectors can be sent to the volatile RAM 120 in each channel as shown in FIG. 1. The host waits 604 for acknowledgement, and the results are loaded from the storage compute device.

As noted above, the host may specify a dense or sparse format when loading a matrix into the storage compute device. These formats may be decided on factors that are convenient to the host, e.g., supported by libraries used by the host. The choice of matrix storage formats can have impact on the efficiency of computation. For example, consider multiplying two dense matrices together in the traditional row by column method. To keep operand data fed at a high rate to the computation engine, the first matrix may best be stored in a format that stores the data in a row together (in a page of NVRAM, for example). The second matrix, however, may best be stored in a format that stores the data in each column together (again, in a page of NVRAM, for example).

Figure 7:
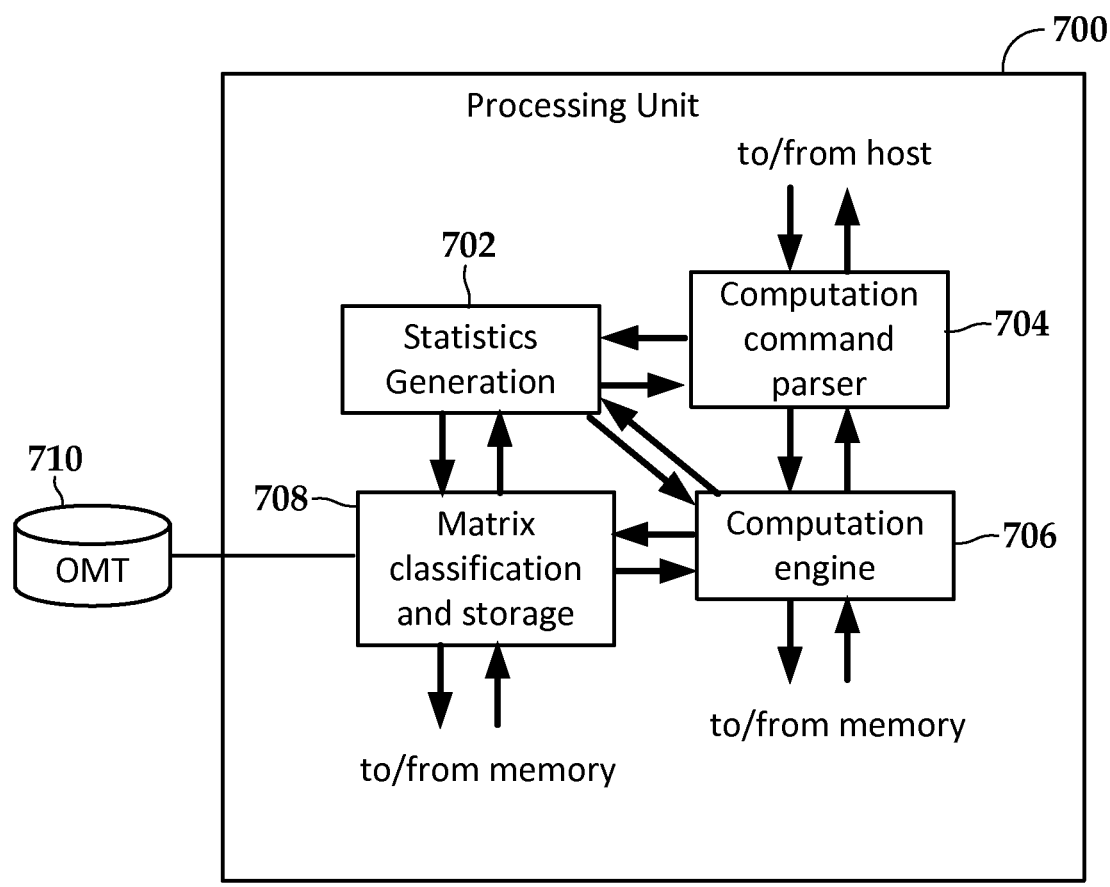
FIG. 7 is a block diagram illustrating a processing unit according to an example embodiment.

By moving matrix computation to a storage compute device (for example integrating matrix computation hardware inside of an storage device) there are some similar issues and some new issues that may arise. For example, the software kernel optimization performed for CPUs and graphics processor may adapted for the storage device to better match its attributes. It may be burdensome for the host to perform these optimizations as they do today due to the more complex access behavior of NVRAM (e.g., flash memory) as compared the DRAM and processor caching hierarchies. Therefore a storage compute device implementing matrix computation hardware may be configured to perform these types of optimizations on its own for fast and efficient computation. For example, a storage compute device may include computation statistics generation hardware that facilitates storing or accessing matrix data in the format that improves the performance and efficiency of matrix computations on the storage compute device In reference now to FIG. 7, a block diagram illustrates a processing unit 700 that may be used in a storage compute device according to an example embodiment. The processing unit 700 may be used in a device such as device 100 shown in FIG. 1. The processing unit includes matrix computation statistics generation hardware 702 that is capable of observing, collecting, and communicating attributes of the source matrices and computational efficiencies as data is being ingested into the device. For example, the statistics generation hardware 702 may work in parallel with computation parser 704 and computation engine 706, examining data already present in the device, or examining data as computation is underway.

Statistics that may be generated by the statistics generation hardware 702 include, but are not limited to, density attributes of the source data, locality of operands in memory, data access latencies being observed, the amount of data fetched (in a flash page for example) that is actually used for computation before it is discarded from temporary storage buffers (SRAM, DRAM, etc.). As shown, the statistics generation hardware 702 operates with a matrix classification and storage unit 708 that manages storage of various formats via OMT database 710, and may change formats of matrices (or add copies of matrices in different formats) based on the statistics generated.

The hardware matrix computation engine 706 may be integrated in to a storage compute device with certain known attributes. Those attributes may include size, speed, latency, line size, etc. of temporary storage buffers (e.g. SRAM, DRAM), width and latency of compute units, etc. This computation engine 706 may have the ability to support various matrix formats for data operand fetch and execution.

The processing unit 700 may be configured to observe the outputs of the computation statistics generation hardware and using this information, along with the known attributes of the hardware matrix computation engine 706 to optimize the data execution and operand fetch patterns of the hardware matrix computation engine 706. This may also involve signaling to the host via command parser 704. For example, the processing unit 700 may provide hints about preferred formats for newly added and future matrix objects in the event some translation can be more efficiently handled by the host.

The source matrices provided by the host may be stored in multiple formats on the media simultaneously. The processing unit 700 may keep track of the source formats available for a given matrix, have a table of known ideal matrix computation attributes that each format addresses, and use the information from the table and the statistics generation hardware to select the optimal matrix format that the hardware matrix computation engine should select its operand data from. The selection of formats may be used for initial matrix object provided by the host, intermediate data objects, and final results objects communicated back to the host. The statistics data may be maintained as part of the OMT database 710, or stored in a separate database (not shown).

The processing unit 700 may provide these optimizations as a pre-processing step before actual data execution, or may occur in real-time adaptively as execution proceeds. These optimizations may continue to change as execution proceeds and attributes of the source data or computations change. The processing unit 700 may also take into account the requested formats of the host, e.g., to offload format translation processing from the host if it can be done more efficiently by the storage compute device.

Figure 8:
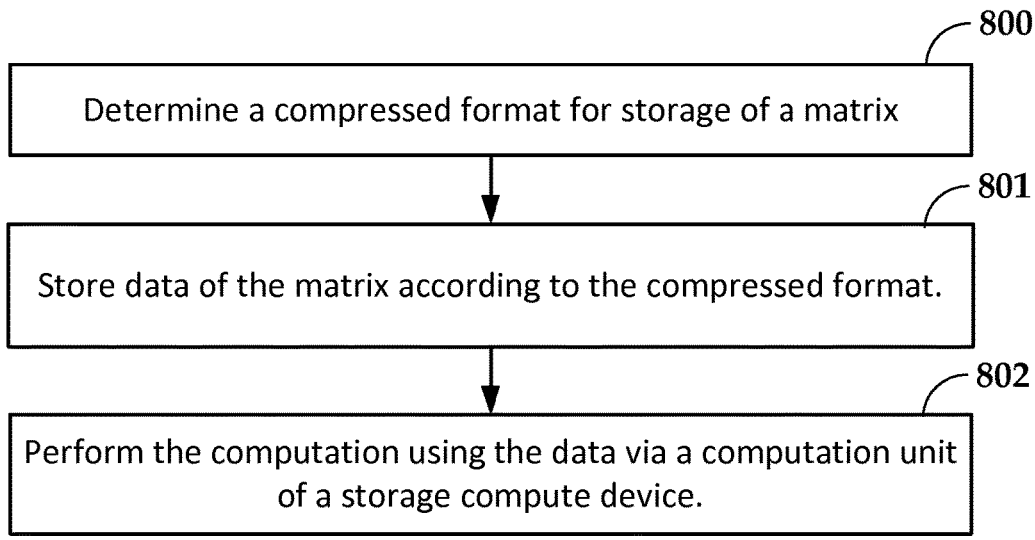
FIGS. 8-9 are flowcharts illustrating methods according to an example embodiment.

In reference now to FIG. 8, a flowchart illustrates a method according to another example embodiment. The method involves determining 800 a compressed format for storage of a matrix. The compressed format is selected based on a computation to be performed using the matrix and architecture of a storage compute device to which the matrix is stored. Data of the matrix is stored 801 on the storage compute device according to the compressed format. The computation is performed 802 using the data via a computation unit that resides within the storage compute device.

Figure 9:
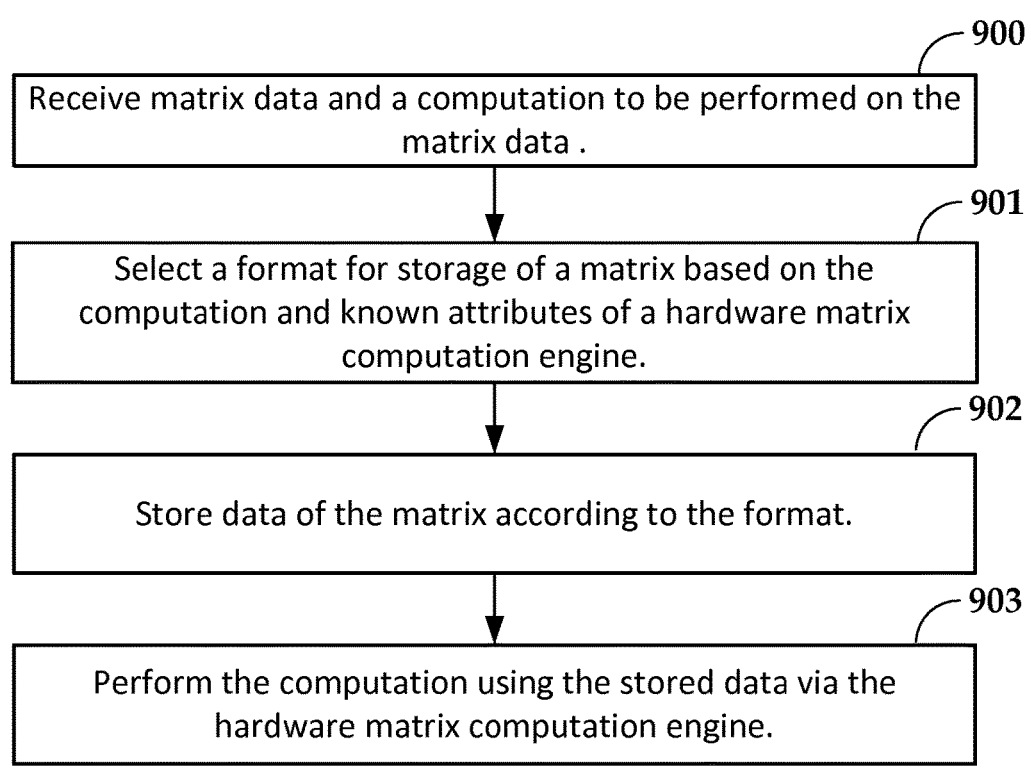

In reference now to FIG. 9, a flowchart illustrates a method according to another example embodiment. The method involves receiving 900, at a storage compute device from a host, matrix data and a computation to be performed on the matrix data by the storage compute device. A format is selected 901 for storage of a matrix based on the computation and known attributes of a hardware matrix computation engine of the storage compute device. Data of the matrix is stored 902 on the data storage device according to the format. The computation is performed 903 using the stored via the hardware matrix computation engine.

The various embodiments described above may be implemented using circuitry and/or software modules that interact to provide particular results. One of skill in the computing arts can readily implement such described functionality, either at a modular level or as a whole, using knowledge generally known in the art. For example, the flowcharts illustrated herein may be used to create computer-readable instructions/code for execution by a processor. Such instructions may be stored on a non-transitory computer-readable medium and transferred to the processor for execution as is known in the art.

The foregoing description of the example embodiments has been presented for the purposes of illustration and description. It is not intended to be exhaustive or to limit the inventive concepts to the precise form disclosed. Many modifications and variations are possible in light of the above teaching. Any or all features of the disclosed embodiments can be applied individually or in any combination and are not meant to be limiting, but purely illustrative. It is intended that the scope be limited not with this detailed description, but rather determined by the claims appended hereto.

What is claimed is:

1. A method, comprising:
   receiving a matrix from a host via a host interface of a data storage device, the host comprising a central processing unit and the data storage device comprising a local processor separate from the central processing unit of the host;
   selecting a compressed format for storage of the matrix based on a computation to be performed using the matrix and architectures of a computation unit of the storage compute device and the non-volatile memory to which the matrix is stored;
   storing data of the matrix on the non-volatile memory of the storage compute device according to the compressed format; and
   performing the computation using the data via a computation unit that resides within the storage compute device.

2. The method of claim 1, wherein the compressed format is selected based on one or more of size of temporary storage buffers, page sizes of the storage compute device, and latency of the computation unit.

3. The method of claim 1, wherein the computation comprises a multiplication, and wherein the compressed format is selected based on speed of accessing one of rows or columns of the matrix.

4. The method of claim 1, further comprising creating an object metadata table for the matrix, the object metadata table including information about the compressed format.

5. The method of claim 1, wherein performing the computation using the data via the computation unit comprising performing the computation in the compressed format.

6. The method of claim 1, further comprising determining one or more additional compressed formats and storing the data of the matrix on the storage compute device according to the one or more additional compressed formats.

7. The method of claim 1, further comprising determining a second compressed format for a results matrix of the computation, the second compressed format based on a second computation to be performed using the results matrix and the architecture of the storage compute device, and storing data of the results matrix on the storage compute device according to the second compressed format.

8. The method of claim 1, wherein the host interface of the storage compute device receives the matrix and a command using a protocol associated with a legacy hard drive host interface, the command defining the computation to be performed on the matrix.

9. A storage compute device, comprising:
   a host interface;
   a channel interface that facilitates access to non-volatile memory; and
   a processing unit coupled to the host interface and the channel interface, the processing unit configured to:
      receive a matrix object from a host via the host interface, the host comprising a central processing unit separate from the processing unit of the storage compute device;
      determine a compressed format for storage of the matrix object to the non-volatile memory, the compressed format selected based on a computation to be performed using the matrix object and architecture of the non-volatile memory;
      receive data of the matrix object via the host interface and store the data to the non-volatile memory according to the compressed format; and
      perform the computation using the data.

10. The storage compute device of claim 9, wherein the data of the matrix object is received via the host interface in an initial compressed format that is different than the compressed format, the processing unit further configured to additionally store the data in the initial compressed format.

11. The storage compute device of claim 9, wherein the compressed format is selected based on one or more of size of temporary storage buffers, page sizes of the storage compute device, and latency of processing unit.

12. The storage compute device of claim 9, wherein the computation comprises a multiplication, and wherein the compressed format is selected based on speed of accessing one of rows or columns of the matrix object.

13. The storage compute device of claim 9, wherein the processing unit is further configured to create object metadata table for the matrix object, the object metadata table including information about the compressed format.

14. The storage compute device of claim 9, wherein performing the computation comprises performing the computation in the compressed format.

15. The storage compute device of claim 9, wherein the processing unit is further configured to determine one or more additional compressed formats and storing the data of the matrix object on the storage compute device according to the one or more additional compressed formats.

16. The storage compute device of claim 9, wherein the processing unit is further configured to determine a second compressed format for a results matrix of the computation, the second compressed format based on a second computation to be performed using the results matrix and the architecture of the storage compute device, and storing data of the results matrix on the storage compute device according to the second compressed format.

17. A method, comprising:
   receiving, at a storage compute device from a host, matrix data and a computation to be performed on the matrix data by the storage compute device;
   selecting a format for storage of a matrix, the format selected based on the computation and known attributes of a hardware matrix computation engine of the storage compute device;
   storing data of the matrix on the storage compute device according to the format; and
   performing the computation using the stored data via the hardware matrix computation engine.

18. The method of claim 17, wherein the attributes of the hardware matrix computation engine comprise any combination of:
   fetch patterns of the hardware matrix computation engine;
   size, speed, latency, and line size of temporary storage buffers; and
   width and latency of the hardware matrix computation engine.

19. The method of claim 17, wherein the format is selected during a pre-processing step before performing the computation.

20. The method of claim 17, wherein the format is selected adaptively as the computation is proceeding.

21. The method of claim 17, wherein the format is determined based on any combination of density of the matrix data, locality of operands in memory, observed data access latencies, an amount of the matrix data fetched that is actually used for the computation before it is discarded from temporary storage buffers.

* * * * *